(12) United States Patent
Tangpuz et al.

(10) Patent No.: US 6,943,434 B2
(45) Date of Patent: Sep. 13, 2005

(54) METHOD FOR MAINTAINING SOLDER THICKNESS IN FLIPCHIP ATTACH PACKAGING PROCESSES

(75) Inventors: Consuelo N. Tangpuz, Lapulapu (PH); Romel N. Manatad, Mandaue (PH); Margie T. Rios, Mandaue (PH); Erwin Victor R. Cruz, Lapulapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/678,010

(22) Filed: Oct. 2, 2003

(65) Prior Publication Data

US 2004/0130009 A1 Jul. 8, 2004

Related U.S. Application Data

(60) Provisional application No. 60/417,800, filed on Oct. 3, 2002.

(51) Int. Cl.⁷ ............................................. H01L 23/495
(52) U.S. Cl. ..................... 257/666; 257/667; 257/674; 438/123
(58) Field of Search ............................... 257/666, 667, 257/674

(56) References Cited

U.S. PATENT DOCUMENTS

| | | | | |
|---|---|---|---|---|
| 5,316,205 A | * | 5/1994 | Melton | 228/180.21 |
| 6,274,905 B1 | | 8/2001 | Mo | 257/330 |
| 6,297,562 B1 | | 10/2001 | Tilly | |
| 6,307,755 B1 | | 10/2001 | Williams et al. | |
| 6,316,822 B1 | * | 11/2001 | Venkateshwaran et al. | . 257/666 |
| 6,351,018 B1 | | 2/2002 | Sapp | 257/499 |
| 6,391,758 B1 | | 5/2002 | Lo et al. | |
| 6,457,233 B1 | * | 10/2002 | Shimizu | 29/840 |
| 6,507,120 B2 | * | 1/2003 | Lo et al. | 257/778 |
| 6,510,976 B2 | * | 1/2003 | Hwee et al. | 228/180.22 |
| 6,720,642 B1 | | 4/2004 | Joshi et al. | |
| 6,774,466 B1 | | 8/2004 | Kajiwara et al. | |
| 2002/0182843 A1 | * | 12/2002 | Pu | 438/615 |
| 2003/0089923 A1 | * | 5/2003 | Oida et al. | 257/200 |
| 2003/0143406 A1 | * | 7/2003 | Siegel et al. | 428/447 |
| 2003/0193080 A1 | | 10/2003 | Cabahug et al. | 257/666 |
| 2004/0169261 A1 | * | 9/2004 | Iitani et al. | 257/676 |

OTHER PUBLICATIONS

U.S. Appl. No. 09/464,885, filed Dec. 16, 1999, Joshi et al.
Joshi, R.; Manatad, R.; Tangpuz, C.; Flip Chip in Leaded Molded Package (FLMP); *Fairchild Semiconductor*; pp. 25–29; 2002.
U.S. Appl. No. 10/413,668, filed Apr. 14, 2003.

* cited by examiner

*Primary Examiner*—David Nelms
*Assistant Examiner*—Tu-Tu Ho
(74) *Attorney, Agent, or Firm*—Kenneth E. Horton; Kirton & McConkie

(57) ABSTRACT

A packaging assembly for semiconductor devices and a method for making such packaging is described. The invention provides a non-Pb bump design during a new flip-chip method of packaging. The design uses special conductive materials in a stud form, rather than a solder ball containing Pb. This configuration maintains a desirable solder thickness between the die and the leadframe and forms a high standoff by restricting solder wettabilty on the leadframe side. This configuration also absorbs any stress and protects the die from cracking. The invention also provides methods for making such semiconductor packages.

24 Claims, 8 Drawing Sheets

SELECTIVE PLATING LEADFRAME

FULLY SOLDERABLE LEADFRAME PAD

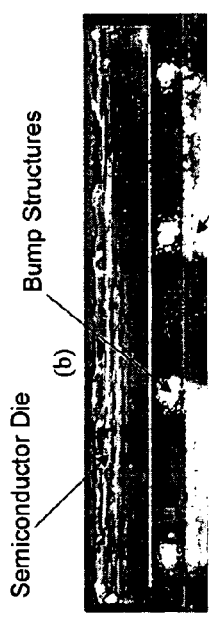

Fig. (a) is a photo of attached die with metal stud in a fully solderable leadframe pad.

Fig. (c) is a SEM photo of cross-sectioned die with metal stud attached in a fully solderable leadframe pad. The solder spreads widely in the pad and the solder thickness between metal stud and leadframe is thin.

SELECTIVE SOLDERABLE LEADFRAME PAD

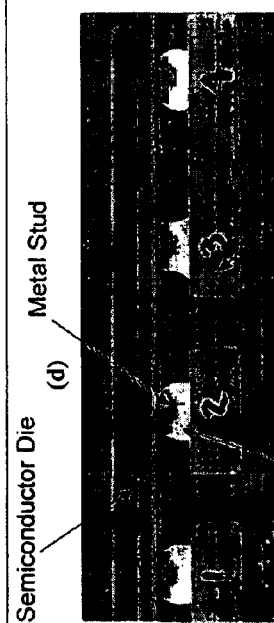

Fig. (b) is a photo of attached die with metal stud in a selective solderable area of leadframe pad.

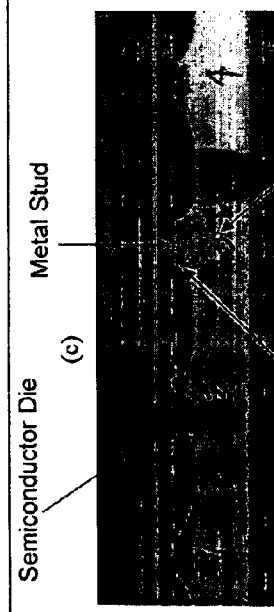

Fig. (d) is a SEM photo of cross-sectioned die with metal stud attached in a selective solderable leadframe pad. The solder is limited to a certain area of the leadframe and the solder thickness between metal stud and leadframe is thick.

FIG. 11

SELECTIVE PLATING LEADFRAME
CROSS-SECTION (SELECTIVE PLATING FRAME)
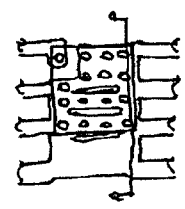
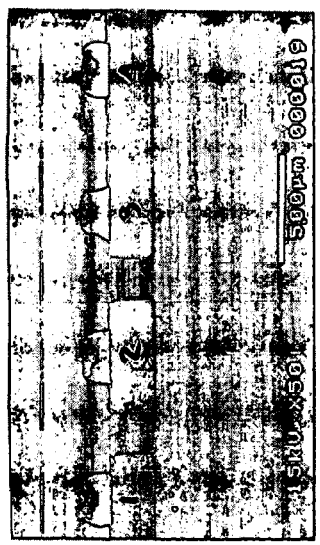
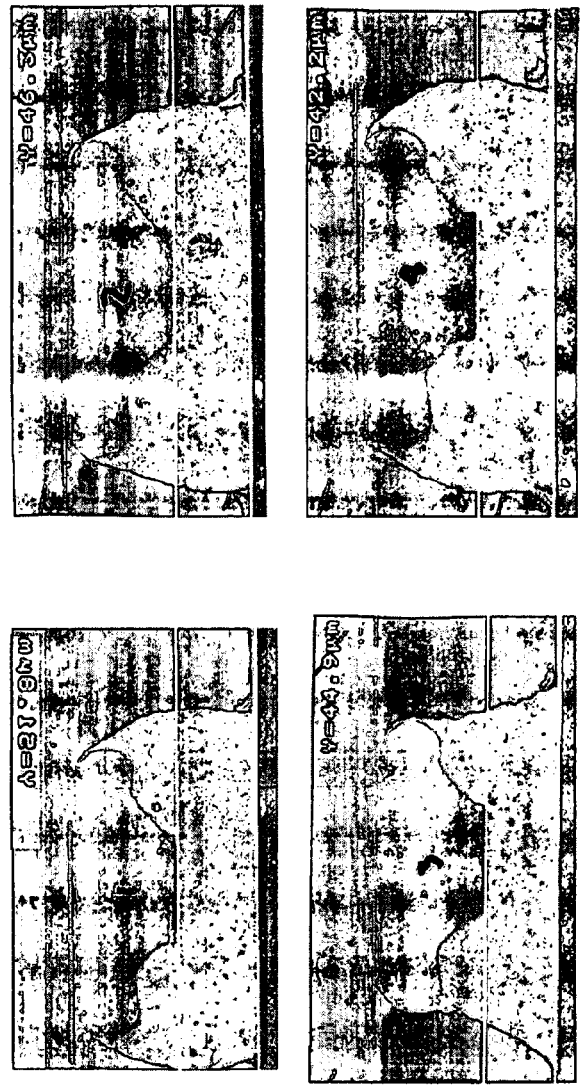
FIG. 12

SELECTIVE PLATING LEADFRAME
CROSS-SECTION (NON - SELECTIVE PLATING FRAME)
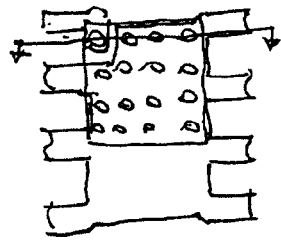
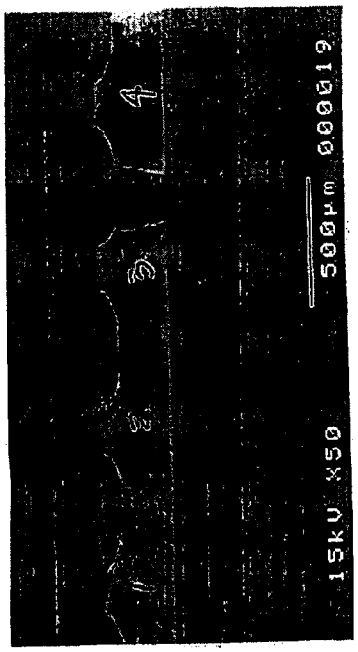
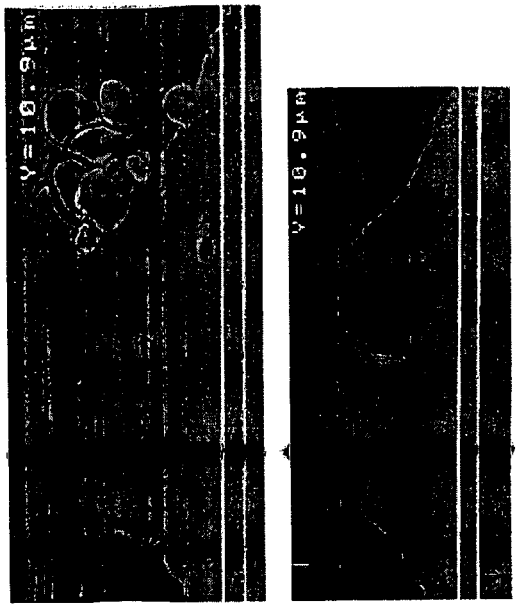
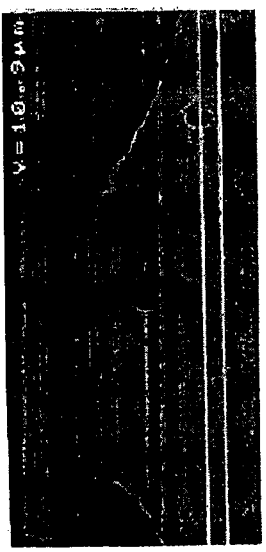
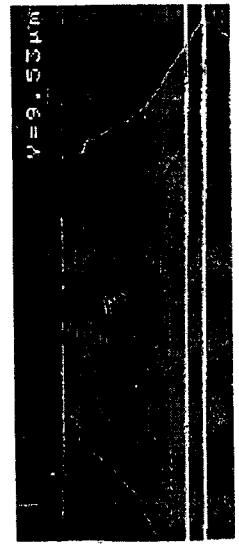
FIG. 13

METHOD FOR MAINTAINING SOLDER THICKNESS IN FLIPCHIP ATTACH PACKAGING PROCESSES

CROSS-REFERENCE TO RELATED APPLICATION

This application claims priority of U.S. Provisional Application No. 60/417,800, filed on Oct. 3, 2002, the entire disclosure of which is incorporated by reference.

FIELD OF THE INVENTION

The invention generally relates to methods for fabricating integrated circuits (ICs) and semiconductor devices and the resulting structures. More particularly, the invention relates generally to the packaging used for semiconductor devices and methods for making such packaging.

BACKGROUND OF THE INVENTION

Semiconductor processing builds hundreds of individual IC chips on a wafer. These individual chips are then cut, tested, assembled, and packaged for their various uses. The packaging step in this processing can be an important step in terms of costs and reliability. The individual IC chip must be connected properly to the external circuitry and packaged in a way that is convenient for use in a larger electrical circuit or system.

There are a number of different types of packages for semiconductor device ("semiconductor packages" or "packages"). One type of semiconductor package is called a flip chip in a leaded molded package (FLMP). This package is described in detail in U.S. patent application Ser. Nos. 09/464,885 and 10/413,668, the disclosures of which are incorporated herein by reference. The FLMP contains a leadframe structure that has a die attach pad and leads that extend away from the die attach pad. The die attach pad is coupled to the front side of a semiconductor die with solder. A molding material covers the die attach pad and the front side of the semiconductor die, while the back side of the semiconductor die is exposed through the molding material. The leads extend laterally away from the molding material and are substantially co-planar with the back side of the semiconductor die and a surface of the molding material. The front side of the semiconductor die may contain the gate region and the source region of a MOSFET (metal oxide semiconductor field effect transistor) in the semiconductor die. The back side of the semiconductor die may contain the drain region of the MOSFET. When the semiconductor package is mounted to a circuit substrate, the back side of the die and the leads are connected to conductive lands on the circuit substrate. The circuit substrate may be a printed circuit board.

Such a semiconductor package has a number of advantages. First, because there is a substantially direct electrical connection between the back side of the semiconductor die and the circuit substrate. Because there are short, low-resistance conductive paths between the source and gate regions in the semiconductor die as well as the circuit substrate, the die package resistance is nearly eliminated. This results in one of the industry's lowest $R_{DS(ON)}$ based on the size of the footprint. $R_{DS(ON)}$ is the on-resistance that is associated with turning a MOSFET in the die package on from an off-state.

The second advantage of the above-described semiconductor package is the reduced thickness. For example, compared to a conventional wire bonded SOIC-8 package, which is about 1.6 mm tall, a FLMP can have a height of less than about 1.0 mm. The FLMP can have the same or better electrical and thermal performance while also being smaller than a standard SOIC-8 package. And thinner semiconductor packages are especially desirable as the size of portable electronic devices (such as wireless phones and laptop computers) continue to decrease.

While the above-described semiconductor package has a number of advantages, a number of improvements could be made. When mass producing semiconductor packages of the type described above, a number of problems can occur. The problems include, for example, silicon cracks that form because of an uneven die standoff from the die attach region of the leadframe structure; moisture seepage into the semiconductor package; delamination between the leadframe structure and the molding material; and finally molding material bleed on an exposed die surface and leads (that can hinder the package from functioning efficiently or potentially fail during device applications). Other problems include poor solder adhesion between the circuit board bonding pads and the semiconductor die, as well as uneven cutting during the singulation process.

In one improvement of this method, a Pb-based solder bump has been used to serve as a stress absorber, thereby protecting the silicon die from cracking when a compressive or a thermal stress is applied. See U.S. patent application Ser. No. 10/413,668, the disclosure of which is incorporated herein by reference. However, Pb is an undesirable material to be used in bumps for two reasons. First, it is a hazardous material. Second, the existing electroplated Pb-based solder bumping process is relatively expensive when compared to direct metal bumping processes.

SUMMARY OF THE INVENTION

The invention provides a packaging assembly for semiconductor devices and a method for making such packaging. The invention provides a non-Pb bump design during a new flip-chip method of packaging. The design uses special conductive materials in a stud form, rather than a solder ball containing Pb. This configuration maintains a desirable solder thickness between the die and the leadframe and forms a high standoff by restricting solder wettabilty on the leadframe side. This configuration also absorbs any stress and protects the die from cracking. The invention also provides methods for making such semiconductor packages.

BRIEF DESCRIPTION OF THE DRAWINGS

The following description of the invention can be understood in light of FIGS. 1–10, in which:

FIGS. 11–13 are SEM photographs illustrating various aspects and advantages of the invention.

FIGS. 1–13 illustrate specific aspects of the invention and are a part of the specification. Together with the following description, the Figures demonstrate and explain the principles of the invention. In the drawings, the thickness of layers and regions are exaggerated for clarity. It will also be understood that when a layer is referred to as being "on"

another layer or substrate, it can be directly on the other layer or substrate, or intervening layers may also be present. The same reference numerals in different drawings represent the same element, and thus their descriptions will not be repeated.

DETAILED DESCRIPTION OF THE INVENTION

The following description provides specific details in order to provide a thorough understanding of the invention. The skilled artisan, however, would understand that the invention can be practiced without employing these specific details. Indeed, the invention can be practiced by modifying the illustrated method and resulting product and can be used in conjunction with apparatus and techniques conventionally used in the industry. For example, while the semiconductor packages described herein are "single-sided," the invention could be easily modified for semiconductor packages that are "double-sided". Indeed, as described briefly below, the invention can be adapted for packaging systems for electronics devices other than just ICs, such as silicon MEMS or optoelectronic devices.

The invention includes packaging assembly for integrated circuit and semiconductor devices that contains non-Pb stud bumps in place of Pb solder balls, including those illustrated in the Figures and described below. The invention also includes any method(s) for making such semiconductor packages, including the methods illustrated in the Figures and described below.

Figure 10:
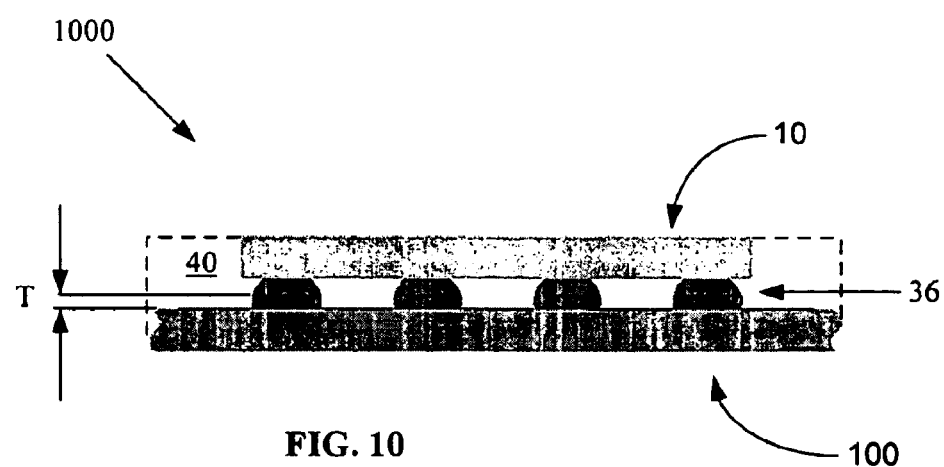
FIG. 10 depicts the semiconductor package in one aspect of the invention.

In one aspect, as shown in FIG. 10, the invention includes a semiconductor package 1000 comprising a leadframe structure (or leadframe) 100 and a semiconductor die (or die) 10 attached to the leadframe structure 100. An array of bump structures 36 is contained between the semiconductor die 10 and the leadframe structure 100. The leadframe structure 100 and the semiconductor die 10 can be partially or fully encapsulated by a molding material 40.

The semiconductor die 10 in the semiconductor package 1000 often contains a transistor, such as a vertical power transistor. Exemplary vertical power transistors are described, for example, in U.S. Pat. Nos. 6,274,905, and 6,351,018, the entire disclosures of which are herein incorporated by reference. Vertical power transistors include both VDMOS transistors and/or vertical bipolar power transistors.

When the semiconductor die 10 comprises a vertical transistor (i.e., a vertical MOSFET), the source region and the gate region (not shown) of the vertical transistor can be located on a first side 14 and the drain region can be located on a second side 15 of the semiconductor die 10. In this aspect of the invention, the second side 15 of the die 10 can be coated with gold or any other solder-wettable material. The drain region on the second side can be coupled to a substrate (i.e., a circuit board) as known in the art.

Figure 1:
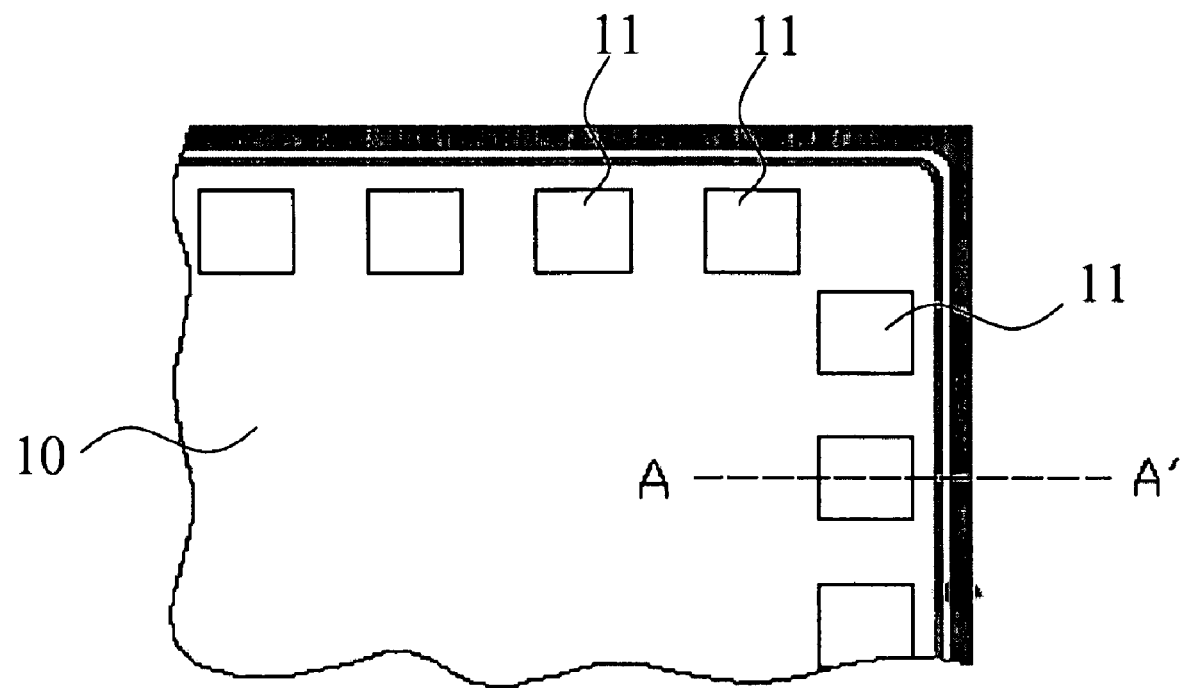
FIGS. 1 and 2 illustrate a die used in one aspect of the invention.
Figure 2:
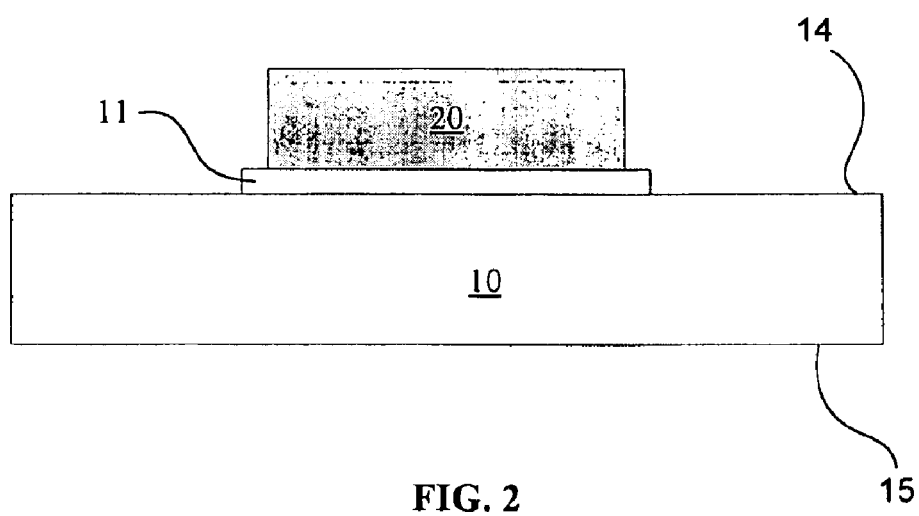

As shown in FIGS. 1 and 2, the semiconductor die 10 contains bond pads 11. The bond pad is that portion of the die 10 through the die is attached to the leadframe structure 100 via bump structures 36. To enhance the bond between the semiconductor die 10 and the leadframe structure 100 (described below), the bond pads 11 in the semiconductor die 10 may be formed with uneven surfaces so that the metal stud 20 on the bond pads tightly adheres thereto.

The semiconductor package 1000 also contains leadframe structure 100. The leadframe supports the die 10, serves as a fundamental part of the I/O interconnection system, and also provides a thermally conductive path for dissipating the majority of the heat generated by the die. The leadframe generally contains an interconnected metallized pattern containing first, a centrally located support to which the die will later be attached and second, a network of leads. As known in the art, the leadframe structure may be one of many leadframe structures in a leadframe carrier, which can be in the form of a strip. During processing, the leadframe structures may be present in a leadframe carrier if multiple leadframe structures are processed together.

As known in the art, the leadframe structure generally contains a die attach region, and two or more leads. The leads extend away from the die attach region. A leadframe structure may include a gate lead structure with a gate attach region and a gate lead and a source lead structure with a plurality of source leads and a source attach region. The source lead structure and the gate lead structure are electrically isolated from each other in the semiconductor package that is eventually formed.

Figure 3:
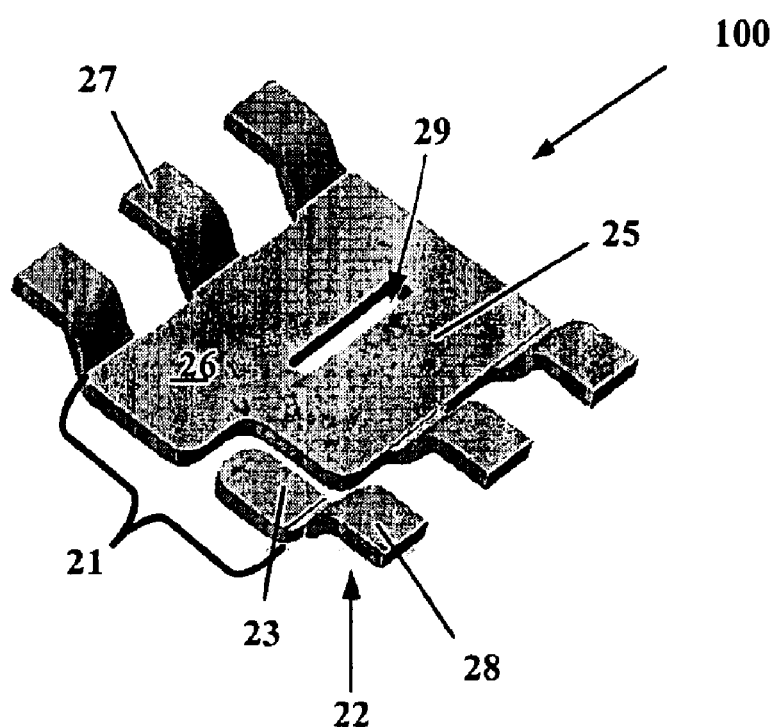
FIGS. 3–4 illustrate leadframe structures used in one aspect of the invention.
Figure 4:
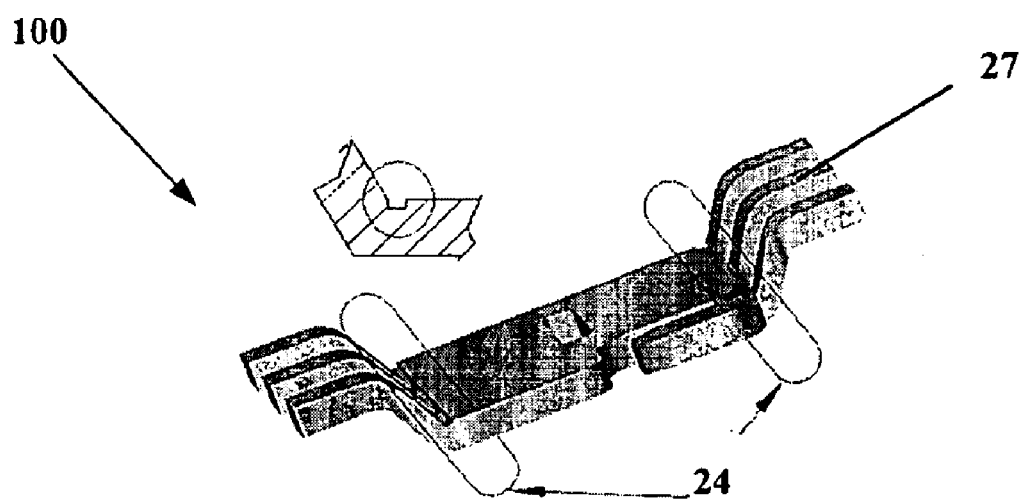

FIGS. 3 and 4 show a leadframe structure 100 according to one aspect of the invention. The leadframe structure 100 comprises a gate lead structure 22 including a gate attach region 23 and a gate lead 28, and a source lead structure 25 including a source attach region 26 and five source leads 27. The gate attach region 23 and the source attach region 26 can form a die attach region 21 of the leadframe structure 100, where the semiconductor die (not shown) is usually attached. The die attach region 21 is "downset" with respect to the ends of the gate lead 24 and the source leads 27.

The metal of the leadframe structure 100 may comprise any metal, such as copper or a copper alloy. In one aspect of the invention the leadframe structure 100 can contain a layer of metal plating (not shown), if desired. The layer of metal plating may comprise an adhesion sublayer such as nickel or chromium; a conductive sublayer such as copper or palladium; and/or an oxidation resistant layer such as gold. For example, the leadframe structure 100 may include a leadframe plating containing an adhesion sublayer and a wettable/protective sublayer. In another example, an exemplary leadframe plating may comprise at least a nickel sublayer and a palladium sublayer. The plating may also comprise a gold sublayer as an outer, solder-wettable sublayer.

The leadframe structure 100 may be configured for additional functionality. In one aspect of the invention, an aperture 29 can be contained in the die attach region 21. The aperture 29 can be in the form of an elongated slot or other shapes (e.g., circular, square, polygonal, etc.). The aperture 29 may be formed in the leadframe structure 100 by any suitable method including photolithography followed by etching, and stamping. Instead of, or in addition to the aperture 29, the die attach region 21 of the leadframe structure 100 may comprise a number of dimples in it to improve adhesion to the molding material. Dimples may be formed in the die attach region 21 of the leadframe structure 100 using any known process such as partial etching. The molding material (not shown) may flow over and attach to the dimples, thus improving the bond between the molding material and the leadframe structure.

In another aspect of the invention, the leadframe structure 100 can be configured with depressions as shown in FIG. 4. Providing depressions 24 in the leadframe structure 100 has a number of advantages. For example, the depressions 24 can restrict the flow of solder paste as a result of capillary action during reflow, thereby restricting the flow of the solder paste towards the lead bends. By restricting the flow of solder paste towards the lead bends, the likelihood of die edge shorting is reduced. There may be up to one depression 24 per lead in the leadframe structure 100. The depressions 24 may have any suitable width and depth.

The die 10 and the leadframe 100 are attached to each other using bump structures 36. Each bump structure 36 comprises a metal stud 20 and reflowed solder paste 103. The array of bump structures 36 results in smaller inductances than, for example, wire bonds.

The metal stud 20 can comprise any conductive material(s) that has a melting temperature greater than the melting temperature of the solder paste 103. In one aspect of the invention, the metal stud 20 may comprise any conductive material or combination of material containing no Pb or containing only negligible amounts of lead. Generally, the material used for the metal stud contains less than about 1 ppm of Pb.

The semiconductor package 1000 also comprises a molding material 40 as an encapsulant. The molding material 40 covers the inner portion (including the die attach region) of the leadframe structure 100, the plurality of solder structures 36, and at least the first side 14 of the semiconductor die 10. The molding material 40 can also fill the spaces between the bump structures 36. As shown in FIG. 10, the bottom surface of the molding material 40 is substantially co-planar with the ends of the leads of the leadframe structure 100, and is also substantially co-planar with the second surface 15 of the semiconductor die 10. As shown, the ends of the leads of the leadframe structure 100 extend laterally away from the molding material 40. Thus, the illustrated semiconductor package 100 has a low profile and is thin.

The molding material 40 can comprise any molding material known in the art that flows well and therefore minimizes the formation of any gaps. In one aspect of the invention, the molding material is an epoxy molding compound such as an epoxy material with the following properties: (a) low thermal expansion (a low CTE), (b) fine filler size (for better flow distribution of the molding material in between small spaces, thus reducing the likelihood of forming voids in the formed semiconductor package), (c) a glass transition temperature of about 146° C., (d) a 10 second Ram Follower gel time at 175° C., and (e) high adhesion strength to pre-plated leadframe structures. A preferred epoxy molding material is Plaskon AMC-2RD molding compound, which is commercially available from Cookson Semiconductor Packaging Materials, of Singapore.

The semiconductor package 1000 can also contain other components, such as metal clips, heat sinks, or the like.

The above semiconductor packages can be made using any suitable method that forms the structures illustrated and described above. In one aspect of the invention, the various IC chips are manufactured, cut, tested, and die-bonded to a substrate as known in the art to form a semiconductor die 10 containing the internal circuitry of the IC.

As shown in FIG. 2, the semiconductor die 10 is provided with an array of I/O points containing bond pads 11. The I/O points are the location where the internal circuitry of the IC will communicate with the external circuitry (i.e., of a circuit board). The bond pads 11 can be provided using any known mechanism in the art.

Then, as known in the art, the die 10 is provided with metal stud 20 on the bond pad 11. Metal stud 20 serves as the main part of the bump structure 36 connecting the die 10 and the leadframe 100. Thus, any metal stud 20 that operates in this manner can be used in the invention.

The metal stud 20 can contain any suitable conductive material known in the art. Examples of such conductive materials include Cu, Au, Pd & their alloys. n one aspect of the invention (as described above), the metal stud 20 does not comprise Pb or contains only negligible amounts of Pb. Pb-based solder bumps are very expensive to manufacture and so are not used in this aspect of the invention. The metal stud 20 can be provided by any process known in the art, including thermosonic bonding, thermocompression bonding, ultrasonic bonding, and the like.

The leadframe structure 100 may then be formed in any suitable manner that makes the leadframe structure described above. For example, the base metal structure of the leadframe structure 100 may comprise copper, and may be formed by stamping or etching a copper sheet. When used, a layer of metal plating may be formed on the base metal structure by processes such as electroless plating, sputtering, or electroplating. A pre-plated leadframe can be used and advantageously eliminates post plating processes, and provides wettable surfaces for solder paste on the conductive lands of a circuit substrate.

When present, the depressions 24 in the leadframe structure 100 may be formed using any suitable process. For example, in some aspects, stamping or a half-etching process can be used to form the depressions. In another examples, a leadframe structure without depressions could be patterned with a photoresist, and then partially etched in those areas where the depressions are to be formed.

Figure 7:
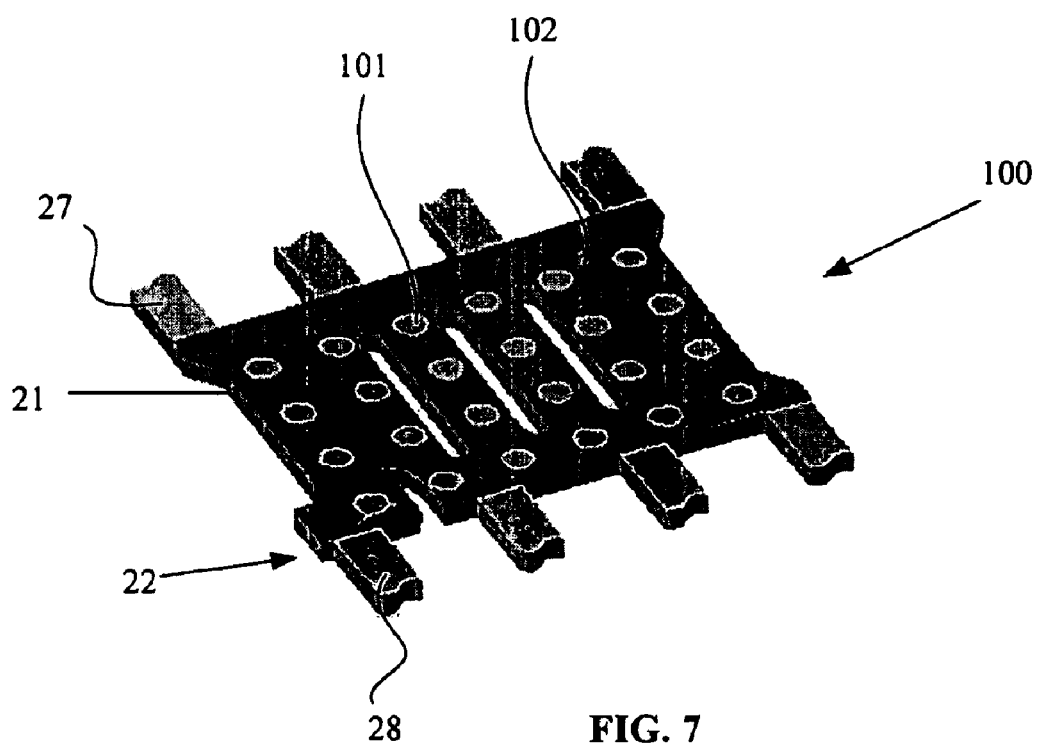

The leadframe structure 100 is then provided with a plurality of solderable areas 101 as shown in FIG. 7. The solderable areas 101 are those portions of the leadframe 100 where the bump structures 36 (and solder paste) will be located. Thus, the solderable areas 101 will be formed where the bump structures 36 will be located.

The array of solderable areas 101 can be formed by any suitable method which provides them with the characteristics described herein. In one aspect of the invention, the solderable areas 101 are formed by a selective plating method (SP Method). In another aspect of the invention, the solderable areas 101 are formed by a polymeric method (P method).

Figure 5:
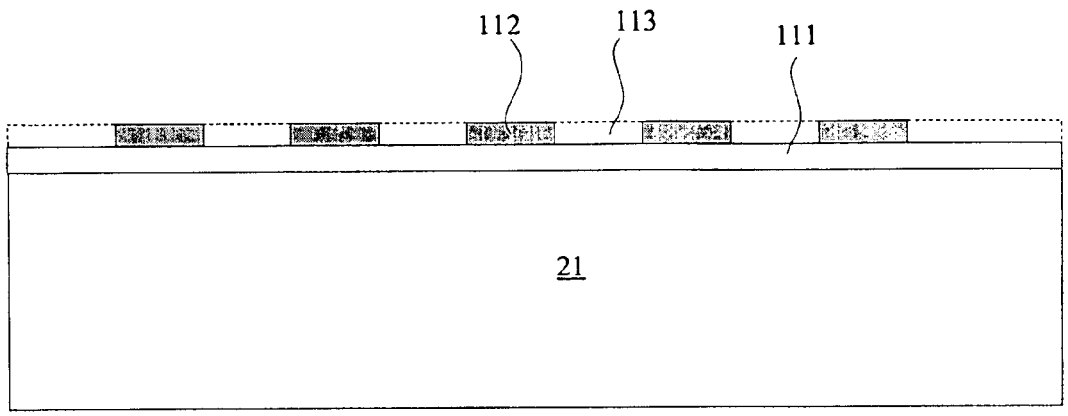
FIGS. 5–9 illustrate methods for making the semiconductor packages in one aspect of the invention.

In the SP method, the solderable areas 101 can be formed by one of two variations. In the first variation of the SP method, and as shown in FIGS. 5 and 7, the solderable areas 101 are formed by first forming a metal coating 111 on the die attach region 21 of the leadframe 100. This metal coating is formed to substantially cover the entire portion of the leadframe that will contain the bump structures 36. The metal coating can be made of any metal or metal alloy that can be oxidized, such as Cu, Ag or Ni. The metal coating can be formed by any method known in the art, such as electroplating, electroless plating or sputtering. In one aspect of the invention, such as when Ni is used, the thickness of the metal coating can range from about 20 to about 80 microinches.

Then, a selective coating 112 is formed on the metal coating 111. The selective coating is formed only on certain areas of the metal coating 111, i.e., those areas where bump structures 36 will be formed and on the external leads. The selective coating can be made of any metal or metal alloy that is not easily oxidized, such as Pd or PdAu, Ag, or noble metals and its alloys, like Pd or PdAu. The selective coating can be formed by any method known in the art, e.g., mask electroplating or depositing a full coating and then using a masking and etching process to define the areas of the selective coating that are to remain. In one aspect of the invention, such as when Pd or PdAu are used, the thickness of the selective coating can range from about 20 to about 90 microinches.

Next, after forming the selective coating 112, the resulting structure is then oxidized. During this oxidation, the metal coating not covered by the selective coating is oxidized to form a metal oxide (i.e., NiO) layer 113. The selective coating 112 does not oxidize during this stage because of the materials it contains. In one aspect of the invention, the thickness of the metal oxide layer 113 should be sufficient to prevent the solder from wetting the oxidized area and/or act as a solder dam for the solder paste. In one aspect of the invention, such where the metal oxide is NiO, the thickness of the metal oxide layer must be at least about 100 Angstroms. Thus, the oxidation is performed for a time and at a temperature sufficient to form the desired thickness.

Figure 6:
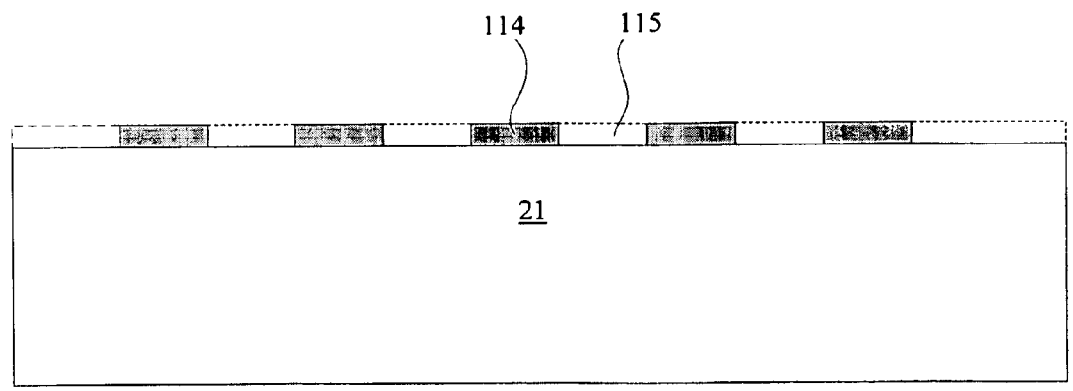

In the second variation of the SP method, and as illustrated in FIG. 6, a metal (i.e., Cu) leadframe is provided with a selective coating 114. The selective coating 114 is formed only on certain areas of the leadframe 100, i.e., those areas where bump structures 36 will be formed and on external leads. The selective coating can be made of any metal or metal alloy that is not oxidized (such as Pd or PdAu). As well, the selective coating can be made from metals and their alloys that act as barrier metal for migration of the leadframe metal and/or that prevent IMC formation (such as NiPd or NiPdAu). The selective coating 114 can be formed by any method known in the art, e.g., mask electroplating or depositing a full coating and then using a masking and etching process to define the areas of the selective coating that are to remain. In one aspect of the invention, such as where the selective coating is NiPd or NiPdAu, the thickness of this layer can range from about 20 to about 90 microinches.

Next, the exposed areas of the metal leadframe 100 are then oxidized to form a metal oxide coating 115 on the leadframe. The thickness of the metal oxide (CuO) coating should be sufficient to prevent the solder from wetting the oxidized area and/or act as a solder dam for the solder paste. In one aspect of the invention, such where the metal oxide coating is CuO, the thickness of the metal oxide coating 115 can be greater than about 100 Angstroms. Thus, the oxidation is performed for a time and at a temperature sufficient to form the desired thickness.

In the P method, a similar process is used. Rather than forming a metal oxide through an oxidation process, however, a polymer coating is selectively formed to define the solderable areas 101. The polymer selected can be any polymer known in the art that does not char or decompose during the temperature excursions. The polymer can also be photosensitive or not. Examples of the polymers include solder masks, polyimide, BCB (benzocyclobutene), and the like. The thickness of the polymer can be greater than about 2 micrometers.

The polymer can be selectively formed by depositing the polymer and removing portions of the polymer layer. In another aspect of the invention, the polymer can be selectively formed by any screen printing process known in the art. After screen printing, the resulting structure is then placed in a reflow furnace for curing the polymer. If necessary, downsetting can be carried out on the leadframe after the curing, As illustrated in FIG. 7, the resulting structure after the SP or P method comprises a lead frame structure 100 with an array of solderable areas 101. The substantially remainder of the surface of the die attach region 21 of the leadframe structure contains non-solderable areas 102.

Figure 8:
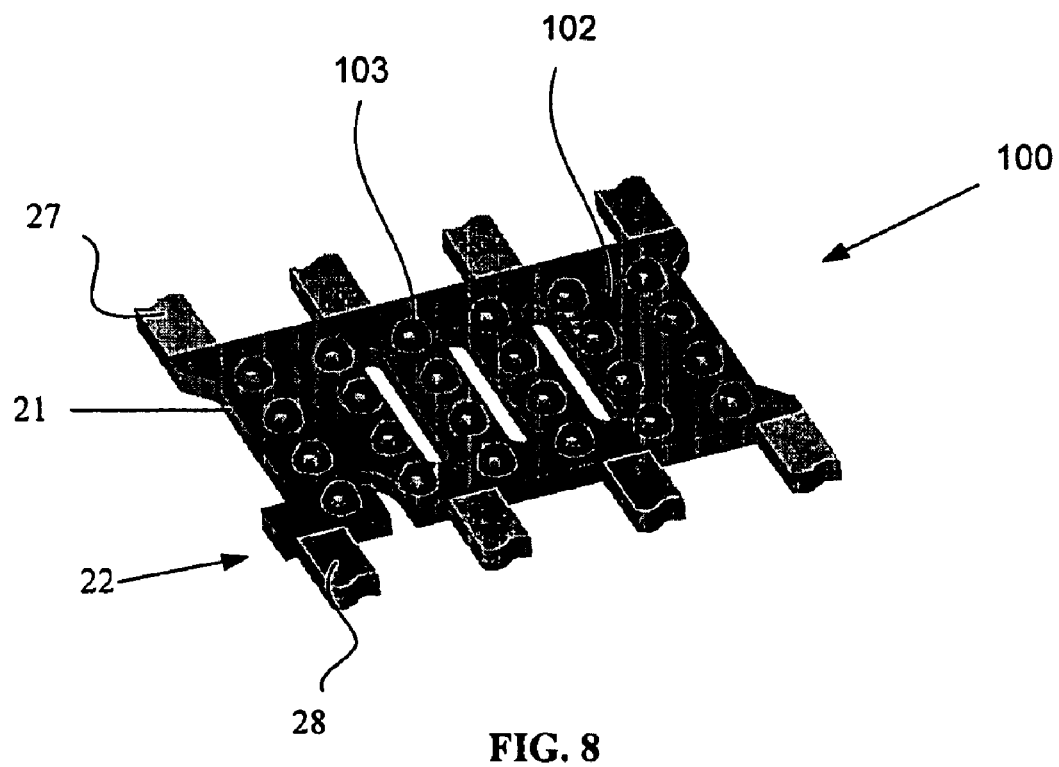

Then, solder paste 103 is placed on the solderable areas 101, as shown in FIG. 8. When the leadframe structure 100 and the die 10 are later combined (as described below), the solder paste acts as a stress absorber. The solder paste can be placed on or in the solderable areas 101 using any known process in the art. For example, solder paste 103 can be dispensed using an array of multiple nozzles. The solder paste 103 may be made of ordinary solder material known in the art.

Figure 9:
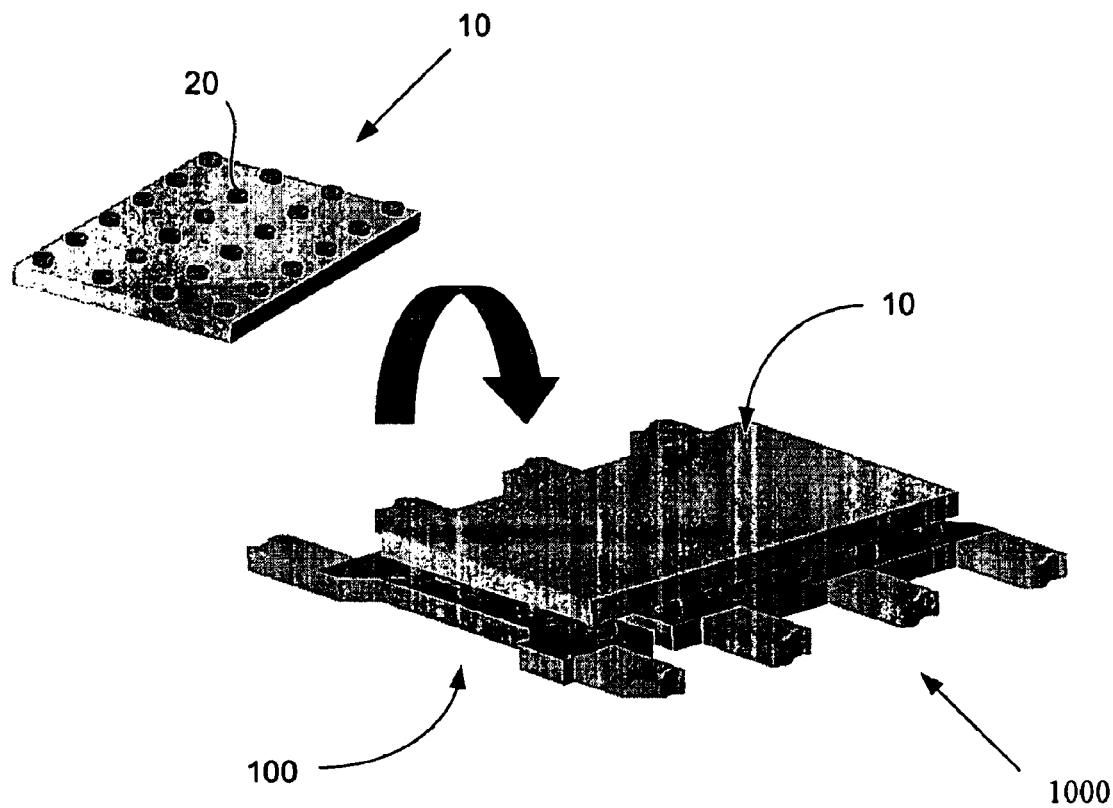

Next, as illustrated in FIG. 9, the leadframe 100 and the die 10 are then joined using any suitable flipchip process. In this process, the bumped semiconductor die 10 is flipped over and aligned with the dispensed array of solder paste 103 on the die attach region 21 of the leadframe structure 100. The die 10 and the leadframe structure 100 are then pressed together.

After attaching the leadframe and die, the solder is reflowed as known in the art to obtain the structure in FIG. 10. The solder-reflow process is performed by heating at a temperature sufficient to reflow the solder paste. When the paste is in this re-flowed state, it contacts the bumps 20 and due to capillary action, "flows" around the bumps and is limited to selective solderable area 101 on the die attach region 21 as shown in FIG. 10. Thus, the solder paste 103 is kept to a desired thickness "T" of about 50 to about 100 micrometers between the metal stud 20 and die attach region 21.

After reflowing, the bump structures 36 provide a mechanical and an electrical connection between the leadframe structure and the semiconductor die. During reflow, the solder paste melts and solidifies, while the metal stud adheres to the solder without melting. This keeps the semiconductor die 10 and the die attach region 21 of the leadframe structure 100 spaced at a uniform distance and keeps the back side 15 of the semiconductor die aligned with the ends of the leads of the leadframe structure.

After the semiconductor die is attached to the leadframe structure, the molding material 40 is molded around the desired portions of the semiconductor die and the leadframe structure. The solder paste between the metal stud 20 and die attach region 21 absorbs the mechanical stress during mold clamping. In one aspect of the invention, a film assisted molding process is used. In this process, a film is used between molding dies of a mold tool. The film serves as a cushion for the semiconductor die during molding, thus absorbing the stress and preventing die cracks too. The use of a film also allows a smaller clamping force to be used. Any films serving these functions can be used in the invention. In one aspect of the invention, the film is an adhesive-free film, which protects the exposed die back side and the leads from mold bleed that can prevent solderability during board mounting. An exemplary adheseive-free film is a fluoropolymer film that has a matted surface finish on one side and a glossy finish on the other side, such as that sold under the tradename AFLEX 50KN.

After the molding process, the gate lead structure of each leadframe structure can be electrically isolated from its corresponding source lead structure by severing the electrical connection between them. Then, the non-singulated semiconductor packages may be electrically tested. Parametric testing is performed while the semiconductor packages are in the form of a strip. After electrical testing, the molded molding material in the semiconductor packages may be laser marked.

After laser marking, the semiconductor packages in the array of semiconductor package are singulated using any suitable process. In one aspect of the invention, the singulation process is a tapeless singulation process. A tapeless singulation process uses a metal saw jig instead of commonly used dicing tapes to hold the semiconductor packages in place during sawing. A strip of molded packages can be loaded onto a jig with recesses that are arranged in a layout similar to the layout of the molded packages in the leadframe carrier, while the back sides of the semiconductor die face upward. The leadframe carrier orientation is chosen to minimize vertical burr formation in the direction of the flat side of the package (which can cause mounting problems). The recesses and vacuum hold the molded packages in place during sawing.

EXAMPLE 1

The advantages of the invention can also be seen in FIGS. 11–13.

Having described the preferred aspects of the invention, it is understood that the invention defined by the appended claims is not to be limited by particular details set forth in the above description, as many apparent variations thereof are possible without departing from the spirit or scope thereof.

We claim:

1. A method for forming a semiconductor package, the method comprising: providing a die with a metal stud on a bond pad;
providing a leadframe containing a plurality of leads, the leadframe containing a solderable area surrounded by a solder dam;
providing a solder paste in or on the solderable area;
attaching the die and the leadframe; and
molding a molding material around a portion of the die and a portion of the leadframe.

2. The method of claim 1, wherein the metal stud contains substantially no Pb.

3. The method of claim 2, wherein the amount of Pb in the metal stud is less than about 1 ppm.

4. The method of claim 1, including attaching the die to the leadframe by flipping the die and contacting the metal stud with the solder paste.

5. The method of claim 1, wherein the solderable area contains a pad comprising a non-oxidizable metal.

6. The method of claim 5, wherein the solder dam comprises a metal oxide or polymer material.

7. The method of claim 6, including providing the metal oxide material by providing a metal and then oxidizing the metal.

8. The method of claim 6, including providing the polymeric material by screen printing.

9. The method of claim 1, including molding by using a film assisted molding process.

10. The method of claim 1, further including re-flowing the solder paste after attaching the die and the leadframe.

11. A method for forming a semiconductor package, the method comprising:
providing a die with a metal stud on a bond pad, the metal stud containing substantially no Pb;
providing a leadframe containing a plurality of leads, the leadframe containing a solderable area surrounded by a solder dam;
providing a solder paste in or on the solderable area;
attaching the die and the leadframe; and
molding a molding material around a portion of the die and a portion of the leadframe.

12. The method of claim 11, wherein the amount of Pb in the metal stud is less than about 1 ppm.

13. The method of claim 11, wherein the solderable area contains a pad comprising a non-oxidizable metal.

14. The method of claim 13, wherein the solder dam comprises a metal oxide or polymer material.

15. The method of claim 14, including providing the metal oxide material by providing a metal and then oxidizing the metal.

16. The method of claim 14, including providing the polymeric material by screen printing.

17. The method of claim 11, including molding by using a film assisted molding process.

18. The method of claim 11, further including re-flowing the solder paste after attaching the die and the leadframe.

19. The method of claim 18, further including providing the leadframe with a depression.

20. The method of claim 19, wherein the depression restricts the flow of the solder paste during the reflow.

21. A method for forming a semiconductor package, the method comprising:
providing a die with a metal stud on a bond pad, the metal stud containing substantially no Pb;
providing a leadframe containing a solderable area surrounded by a solder dam, the solderable area containing a pad comprising a non-oxidizable metal and the solder dam comprising a metal oxide or polymer material;
providing a solder paste in or on the solderable area;
attaching the die and the leadframe; and
molding a molding material around a portion of the die and a portion of the leadframe.

22. A semiconductor package made by the method comprising:
providing a die with a metal stud on a bond pad;
providing a leadframe containing a plurality of leads, the leadframe containing a solderable area surrounded by a solder dam;
providing a solder paste in or on the solderable area;
attaching the die and the leadframe; and
molding a molding material around a portion of the die and a portion of the leadframe.

23. A semiconductor package made by the method comprising:
providing a die with a metal stud on a bond pad, the metal stud containing substantially no Pb,
providing a leadframe containing a plurality of leads, the leadframe containing a solderable area surrounded by a solder dam;
providing a solder paste in or on the solderable area;
attaching the die and the leadframe; and
molding a molding material around a portion of the die and a portion of the leadframe.

24. A semiconductor package made by the method comprising:
providing a die with a metal stud on a bond pad, the metal stud containing substantially no Pb;
providing a leadframe containing a solderable area surrounded by a solder dam, the solderable area containing a pad comprising a non-oxidizable metal and the solder dam comprising a metal oxide or polymer material;
providing a solder paste in or on the solderable area;
attaching the die and the leadframe; and
molding a molding material around a portion of the die and a portion of the leadframe.

* * * * *